United States Patent
Dhayni

(10) Patent No.: US 9,467,238 B2
(45) Date of Patent: Oct. 11, 2016

(54) ON-CHIP STIMULUS GENERATION FOR TEST AND CALIBRATION OF NFC READER RECEIVERS

(71) Applicant: ST-Ericsson SA, Plan-les-Ouates (CH)

(72) Inventor: Achraf Dhayni, Vallauris (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/426,763

(22) PCT Filed: Sep. 12, 2013

(86) PCT No.: PCT/EP2013/068871
§ 371 (c)(1),
(2) Date: Mar. 9, 2015

(87) PCT Pub. No.: WO2014/041049
PCT Pub. Date: Mar. 20, 2014

(65) Prior Publication Data
US 2015/0249510 A1    Sep. 3, 2015

Related U.S. Application Data

(60) Provisional application No. 61/709,238, filed on Oct. 3, 2012.

(30) Foreign Application Priority Data

Sep. 17, 2012  (EP) .................................... 12306121
Apr. 26, 2013  (EP) .................................... 13305551

(51) Int. Cl.
| | |
|---|---|
| *H04B 5/00* | (2006.01) |
| *H04B 17/21* | (2015.01) |
| *G01R 31/317* | (2006.01) |
| *H04B 17/14* | (2015.01) |
| *H04B 17/345* | (2015.01) |
| *H04W 4/00* | (2009.01) |
| *H04W 24/02* | (2009.01) |

(52) U.S. Cl.
CPC ......... *H04B 17/21* (2015.01); *G01R 31/31716* (2013.01); *H04B 5/0056* (2013.01); *H04B 17/14* (2015.01); *H04B 17/345* (2015.01); *H04W 4/008* (2013.01); *H04W 24/02* (2013.01)

(58) Field of Classification Search
CPC .. H04B 5/0056; H04B 17/345; H04B 17/14; H04B 17/21; H04W 4/008; H04W 24/02; G01R 31/31716
See application file for complete search history.

(56) References Cited

U.S. PATENT DOCUMENTS

| | | | |
|---|---|---|---|
| 2009/0088077 A1* | 4/2009 | Brown | H04B 5/02 455/41.2 |
| 2011/0156640 A1* | 6/2011 | Moshfeghi | H02J 7/025 320/108 |
| 2011/0218755 A1* | 9/2011 | Dhayni | G01R 31/31716 702/117 |
| 2011/0299575 A1 | 12/2011 | Ali et al. | |

FOREIGN PATENT DOCUMENTS

| | | |
|---|---|---|
| GB | 2 444 799 A | 6/2008 |
| GB | 2444799 A * | 6/2008 |

OTHER PUBLICATIONS

International Search Report issued in corresponding International application No. PCT/EP2013/068871, date of mailing Nov. 22, 2013.
Extended European Search Report issued in corresponding European application No. EP 13 30 5551, date of completion of the search Nov. 15, 2013.

* cited by examiner

*Primary Examiner* — Ping Hsieh
(74) *Attorney, Agent, or Firm* — Patent Portfolio Builders PLLC

(57) ABSTRACT

A method of determining a calibration of a near field communication, NFC, device, the NFC device comprising a receiver circuit, a transmitter circuit and a load modulator circuit, the method comprising: generating a carrier signal in the transmitter circuit, generating a modulation signal in the load modulator circuit, generating a modulated carrier signal, comprising first and second frequencies, by applying the modulation signal to the carrier signal, applying the modulated carrier signal at an input of the receiver circuit, and determining a response parameter of the receiver circuit on the basis of the response of the receiver circuit to the first and second frequencies in the modulated carrier signal.

12 Claims, 8 Drawing Sheets

ON-CHIP STIMULUS GENERATION FOR TEST AND CALIBRATION OF NFC READER RECEIVERS

TECHNICAL FIELD

The described embodiments generally relate to the test and calibration of Near-Field Communication (NFC) devices, and more specifically to the generation of stimuli for performing such test and callibration. More particularly still, the embodiments relate to devices for the provision of stimuli for the periodic calibration of such NFC devices.

The described embodiments find applications, in particular, in NFC Reader receivers which may be embodied in Integrated Circuits (IC) for wireless devices such as mobile terminal systems (e.g. cell phones, smartphones, etc.), digital media players (e.g. MP3 and MP4 players), DVD player, portable PC, tablets, e-book readers, etc.

RELATED ART

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

NFC is a technology that permits the transfer of information over short distances, typically of the order of 0.1 m. Information can be transferred from one NFC device to another via electromagnetic coupling between the antennas of the two devices. FIG. 1 illustrates an example of NFC between a first device 100 and a second device 105. In this example, at least one of the first 100 and second 105 devices are an NFC reader device, while the other device can be an NFC tag device, or another NFC reader device.

Here, the term NFC reader is used to indicate that a device is capable of transmitting information to another NFC device to interrogate it, and also receiving information from that device. In contrast, the term NFC tag is used to denote a device, typically a passive device, that will respond to an interrogation from an NFC reader by transmitting information, but that cannot initiate NFC.

For the purposes of this example, the first device 100 is assumed to be an NFC reader, while the second device 105 is assumed to be a tag. The first device 100 has an antenna 103, and similarly the second device has a corresponding antenna 107. As noted above, since NFC devices operate over a short range, the antennas 103, 107 must be in close proximity in order to permit NFC to operate.

However, owing to the close proximity of the antennas 103, 107, the proximity of the antenna 107 of the receiving device 105 causes an effective load on the antenna 103 of the transmitting device 100 and vice versa.

As a result, in normal operation, an NFC reader 100 receives a signal that is load-modulated signal by the nearby NFC device 105, in this case a tag. Thus, in the example of an NFC reader device 100 communicating with an NFC tag device 105, the tag's load will modulate the magnetic field of the NFC reader 100.

In operation, a receiver in the NFC reader 100 will demodulate the received load-modulated signal in order to recover the baseband digital signal that has been used by the tag 105 to load-modulate the NFC reader's 100 magnetic field. Therefore, the NFC reader's 100 receiver always deals with a load-modulated signal. As a result, the performance of the receiver is best evaluated and calibrated using load-modulated stimuli. Accordingly, there is a need to provide such load-modulated stimuli for the purposes of calibration and testing of NFC reader and tag devices.

In addition, since the calibration of NFC devices will in general vary over time, with parameters such as ambient temperature, aging of the electronic components and the prevailing radio frequency (RF) field, there is a need for providing load-modulated stimuli for the purposes of calibration and testing that form a part of the NFC device. Ideally, such stimuli will be formed on the same integrated circuit as the NFC circuitry.

US2012/0191400 discloses an integrated chip including test circuitry for testing and calibration of radio frequency modules.

However, the addition of circuitry to provide such stimuli will typically add a lot of complexity, RF silicon overheard, and testability and calibration challenges to the RF front end of the NFC device with which it is associated. Further, there is no advantage provided in terms of calibration by implementing a calibration generator that is as complex as the receiver under test. This is because such a calibration generator will itself need to be calibrated. Accordingly, there is a need to provide load-modulated stimuli that are effected in a simple manner.

SUMMARY

In order to overcome or at least alleviate the above drawbacks, there is proposed a new technique which permits the generation of a double-tone signal which can be used for a second order input intercept (IIP2) calibration of an NFC Reader receiver, without the need of any external calibration generator.

Accordingly, in a first aspect there is provided a method of determining a calibration of a near field communication, NFC, device, the NFC device comprising a receiver circuit, a transmitter circuit and a load modulator circuit, the method comprising: generating a carrier signal in the transmitter circuit, generating a modulation signal in the load modulator circuit, generating a modulated carrier signal, comprising first and second frequencies, by applying the modulation signal to the carrier signal, applying the modulated carrier signal at an input of the receiver circuit, and determining a response parameter of the receiver circuit on the basis of the response of the receiver circuit to the first and second frequencies in the modulated carrier signal.

Thus, by utilising the load modulator already present on the NFC device to generate the modulation frequencies, the method provides a simple method of calibration that can be achieved using no additional hardware.

In some embodiments, the response parameter is determined on the basis of the response at an intermodulation frequency, $f_{IM2}$, corresponding to:

$$f_{IM2} = f_1 - f_2 - f_{IF}$$

where $f_1$ and $f_2$ are the first and second frequencies respectively and $f_{IF}$ is an intermediate frequency of an amplifier in the receiver circuit. Thus, the response parameter can be determined from an intermodualtion frequency generated as a result of the modulation applied to the carrier signal.

In some embodiments, the intermediate frequency, $f_{IF}=0$. Thus, the method can be implemented using a receiver circuit comprising a zero-intermediate-frequency amplifier.

In embodiments, the intermodulation frequency, $f_{IM2}$ is within the bandwidth of the receiver circuit. Thus, it can be ensured that the intermodulation frequency can be detected at the output to the receiver circuit.

In some embodiments, a parameter of a component of the receiver circuit is adjusted to thereby alter the response parameter. Thus, the NFC device can be calibrated by simple adjustment of one of its constituent components.

In some embodiments, repeated determinations of the response parameter are made, each with a different value of the parameter to thereby determine an optimum value of the parameter. Thus, the optimum calibration can be achieved by adjusting only a single parameter.

In some embodiments, the component parameter is a bulk voltage of a transistor in the receiver circuit. In alternative embodiments, the component parameter is the common-mode voltage of a transimpedance amplifier of the receiver circuit, the quality of the local oscillator signals applied to the receiver circuit, the loading applied to mixer transistors of the receiver circuit, or the capacitance of a switchable capacitor in the receiver circuit. In further alternative embodiments, two or more of the above listed component parameters are adjusted in performing the calibration.

In some embodiments, the optimum component parameter is determined, at least in part, by use of a Nelder-Mead optimisation technique. Thus, a rapid calibration can be obtained by using an efficient optimisation terchnique.

In some embodiments, the calibration further comprises determining a received noise level at the receiver circuit in the absence of the applied modulated carrier signal. Thus, advantageously, a check can be made on the calibration results to avoid calibration errors caused by noise in the receiver circuit.

In some embodiments, the first and second frequencies are generated by switching a resistance in the load modulator circuit. Thus, the frequencies can be generated in a simple manner using pre-existing components.

In a second aspect there is provided a near field communication, NFC, device, comprising a receiver circuit, a transmitter circuit and a load modulator circuit, wherein the device is configured to: generate a carrier signal in the transmitter circuit, generate a modulation signal in the load modulator circuit, generate a modulated carrier signal, comprising first and second frequencies, by applying the modulation signal to the carrier signal, apply the modulated carrier signal at an input of the receiver circuit, and determine a response parameter of the receiver circuit on the basis of the response of the receiver circuit to the first and second frequencies in the modulated carrier signal.

In some embodiments, the load modulator of the NFC device additionally comprises a switchable resistor in the load modulator circuit for generating the modulation signal.

In some embodiments, the NFC device forms a part of at least one of: a mobile telephone, a tablet computer, a laptop computer or a smart phone.

A third aspect provides a computer program product comprising computer readable instructions which, when run on a computer system, cause the computer system to perform the method of the first aspect.

A fourth aspect provides a computer readable medium comprising the computer program product according to the third aspect.

BRIEF DESCRIPTION OF THE DRAWINGS

The present invention is illustrated by way of example, and not by way of limitation, in the figures of the accompanying drawings, in which like reference numerals refer to similar elements and in which.

DETAILED DESCRIPTION

The quality of an electronic amplifier can be characterised by parameters known as Input intercept points (IIPs). For example, the second order IIP (IIP2) is defined as the point at which the output power at an input frequency is equal to the output power at the second harmonic frequency (i.e. twice the input frequency). In practice due to amplifier saturation the IIP2 will actually not be attained, and so the position of IIP2 is inferred from extrapolations of the output powers of the input frequency and second harmonic frequency.

Similarly, the third order IIP (IIP3) is defined as the point at which the output power at an input frequency is equal to the output power at the third harmonic frequency (i.e. three times the input frequency).

Thus, to measure the quality of an amplifier in an NFC reader receiver, the IIP2 or IIP3 can be used. Moreover, to meet industry standards, NFC reader receivers are required to attain an IIP2 that respects the specifications. When this requirement is violated, nonlinearities of the receiver start to affect the quality of the received signal.

However, it is difficult to ensure that an electronic amplifier used in an NFC reader receiver will always meet the relevant standards. This is because the IIP2 of a receiver is dependent on the nonlinear behaviours of each of the electric components in the reception (RX) chain. The behaviour is also dependent on effects such as parasitic phenomena, component mismatch, for example between the transistors in a mixer or between the components of the local oscillator drive, common-mode effects, frequency shifts or in-phase-quaderature (I-Q) imbalance. Finally, the IIP2 will also be dependent on environmental factors such as the ambient temperature and/or the age of the electronic components.

For this reason, calibration is generally needed to enable periodic adjustment the receiver circuit. Typically, the adjustment will take the form of a routine that iteratively adjusts the parameters of the receiving circuit to find the maximum achievable IIP2. Accordingly, for calibration based on the IIP2, an on-chip calibration generator is needed to generate the stimuli necessary for the measurement of the IIP2.

Figure 2:
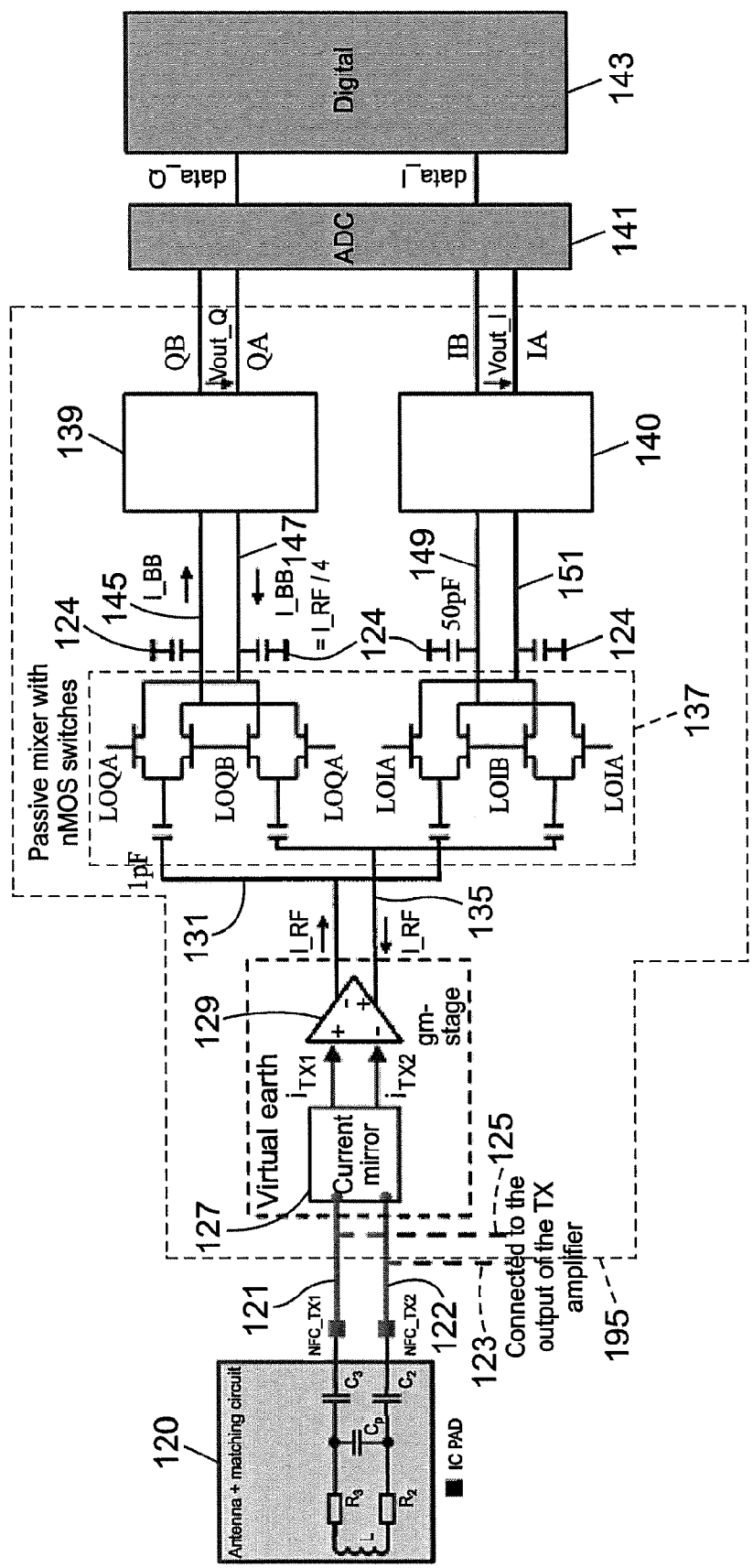
FIG. 2 illustrates a schematic view of a known NFC receiver apparatus.

FIG. 2 illustrates a typical receiver design architecture, generally referenced as 195, and suitable for use with a described embodiment. FIG. 2 illustrates an architecture corresponding to an integrated circuit for use with NFC devices. However, the skilled person will recognise that the described embodiments are not limited to such circuits or architectures. Rather, the described embodiments can generally be applied to all circuits for connection to NFC reader devices.

As illustrated in FIG. 2, an antenna and matching circuit 120 is connected to the receiver circuit via two electrical connections 121, 122. The antenna and matching circuit 120 are of known types commonly used with NFC devices. Accordingly, further details will not be provided here. Rather, it is sufficient to note that the electrical connections 121, 122 from the antenna and matching circuit 120 supply electrical signals generated by the amplifier and matching circuit 120 in response to an ambient electromagnetic field to the receiver 195. The electrical connections 121, 122 to the antenna and matching circuit 120 are also connected to a transmitter (not illustrated) via further electrical connections 123, 125. The electrical signals from the antenna and matching circuit 120 are passed to a current mirror 127. The skilled person will recognise that the current mirror is used to provide a scaled copy of the electrical signals from the antenna and matching circuit 120 whilst not altering the signals generated.

The copied signals from the current mirror 127 are then passed to a transconductance amplifier 129, which is configured to output a current that is proportional to the input voltage. Thus, a scaled and amplified mirror of the signals from the antenna and matching circuit 120 are generated.

The transconductance amplifier 129 has two complimentary outputs 131, 135. Each output of the transconductance amplifier 129 is connected to both the quadrature and in-phase paths of a pair of passive mixers 137. Further detail of the passive mixers 137 will be described below in relation to FIG. 4.

The outputs from the pair of passive mixers 137 comprises two pairs of signals 145, 147, 149, 151. The first pair of signals 145, 147 corresponds to the amplified quadrature signal from the antenna and matching circuit 120, while the second pair 149, 151 corresponds to the amplified in-phase signal from the antenna and matching circuit 120. Each of these signals 145, 147, 149, 151 is connected to ground via a 50 pF switchable capacitor 124. The purpose of these switchable capacitors 124 will be explained further below in relation to FIG. 4.

The first pair of signals 145, 147 is passed to a first trans-impedance amplifier 139, while the second pair of signals 149, 151 are passed to a second trans-impedance amplifier 140. The trans-impedance amplifiers 139, 140 amplify each pair of signals 145, 147, 149, 151. In the described embodiment, the trans-impedance amplifiers 139, 140 also comprise filters (not shown) to filter unwanted frequency components from the amplified signals. If zero-intimidate-frequency (ZIF) transimpedance amplifiers are employed, then the filters will be low-pass filters. However, if non-ZIF transimpedance amplifiers are employed, then the filters will be band-pass filters, with the pass-band centred at the intermediate frequency generated by the transimpedance amplifiers.

The outputs from the pair of transimpedance amplifiers 139, 140 are each converted into digital signals by an analogue to digital converter (ADC) 141, and the digital signals passed to a digital electronics circuit 143. The digital electronics circuit 143 is a digital demodulator. Thus, the analogue outputs from the trans-impedance amplifiers 139, 140 are digitized via the ADC 141 before being fed into the input of the digital demodulator 143 where the digital signals are processed so as to detect digital data embedded within the received signals. The skilled person will recognise that such digital processing is known in the field of NFC, and so a further explanation of this processing will not be repeated here.

To analyse the performance of an NFC reader and determine the IIP2, an input comprising two frequencies can be applied to the receiver circuit 195. The input can, for example, be applied to the connections between an external NFC antenna 120 and the receiver amplifier circuit 129.

In the presently described embodiment, a signal comprising two frequencies, $f_1$ and $f_2$ is injected into the receiver circuit. Here, the frequencies $f_1$ and $f_2$ are selected such that the difference between them, $\Delta f = f_2 - f_1$ is small compared to the channel bandwidth of the RX circuit 195.

Due to the non-ideal nature of the receiver circuit 195, a second order intermodulation tone IM2 is also generated. The IM2 tone is at a frequency: $\Delta f = (f_1 - f_2)$, and when mixed down with the local oscillator (LO) frequency, $f_{LO}$, it coincides with the intermediate frequency (IF). This IF is defined by:

$$f_{IM2} = f_1 - f_2 - f_{IF}$$

In more detail, the IM2 tone will be generated within the transconductance amplifier 129 as a result of the finite linearity of this amplifier. The IM2 tone will be at a frequency: $f_1 - f_2$, where $f_1$ and $f_2$ are such that $(f_1 - f_2) \leq f_{IF}$.

The skilled person will note that the IM2 tone generated in each half circuit of the transconductance amplifier 129 will be equal in both magnitude and sign to that generated in the other half, assuming that the transconductance amplifier 129 has perfect matching. Therefore, the IM2 signal will be observed as a common-mode signal in the output current of the transconductance amplifier 129, and so the differential value of the IM2 will be zero if the transconductance amplifier 129 is perfectly symmetrical.

Any mismatch between the transconductance amplifier 129 half circuits, for example due to circuit components or layout, will result in a low frequency finite differential IM2 at the output. This low frequency IM2 will be upconverted by the LO when it reaches the mixers 137 and so will not appear at the IF output of the mixer. However, any DC offset in the LO of the mixer will result in this IM2 differential component appearing at the mixer output at a frequency $\Delta f = f_1 - f_2$.

In the later stages of the receiver circuit 195, either before or after the ADC 141, the IM2 tone at $(f1 - f2) \leq f_{IF}$ will be down-converted from the IF into the baseband and thus the IM2 is placed into the baseband at frequencies corresponding to $\pm |(f1 - f2) - f_{IF}|$. These frequencies are close to a DC signal.

Thus, effectively two tones ($f_1$ and $f_2$) are injected with a difference in frequency, $\Delta f$, that is small compared to the channel bandwidth of the RX circuit 195, and slightly less than or equal to $f_{IF}$. Due to the second order nonlinearity of the mixers 137, a second-order intermodulation tone, IM2, is created at a frequency $\Delta f = f1 - f2$ at the output of the mixers 137. As noted above, this IM2 tone is caused by the second order nonlinearity in the transconductance amplifier 129 and the DC offset in the LO mixers. The IM2 tone is then down converted to $\pm |(f1 - f2) - f_{IF}|$ as explained above.

As a result, the IM2 tone of the mixer will be observed at a frequency $|(f1 - f2) - f_{IF}|$, and hence $f_{IM2} = f_1 - f_2 - f_{IF}$.

The skilled person will recognise that, for Zero Intermediate Frequency (ZIF) receivers, $f_{IF} = 0$.

As discussed above, IIP2 is defined as the power of the desired signal (in dB) at which the power of the desired signal is equal to the power of the second harmonic. In the case of the receiver design illustrated in FIG. 2, the input signal corresponds to the value of $V_{in}$, while the relevant output corresponds to the voltage output of the trans-impedance amplifier (TIA) stage.

Also as noted above, a higher IIP2 implies a weaker RX second order nonlinearity (i.e. a lower IM2), and vice versa. Consequently, measuring the amplitude of the IM2 tone is equivalent to measuring the IIP2, and calibrating the value of the IM2 is equivalent to IIP2 calibration.

An IIP2 calibration technique which proves to be efficient for the receiver as shown in FIG. 2 can be based on the tuning of the bulk voltage of the mixer 137 transistors. This is because the IIP2 tends to reach a higher value if one pair of transistors of the double-balanced mixer 137 is tuned to be as asymmetrical as the other pair is.

Figure 4:
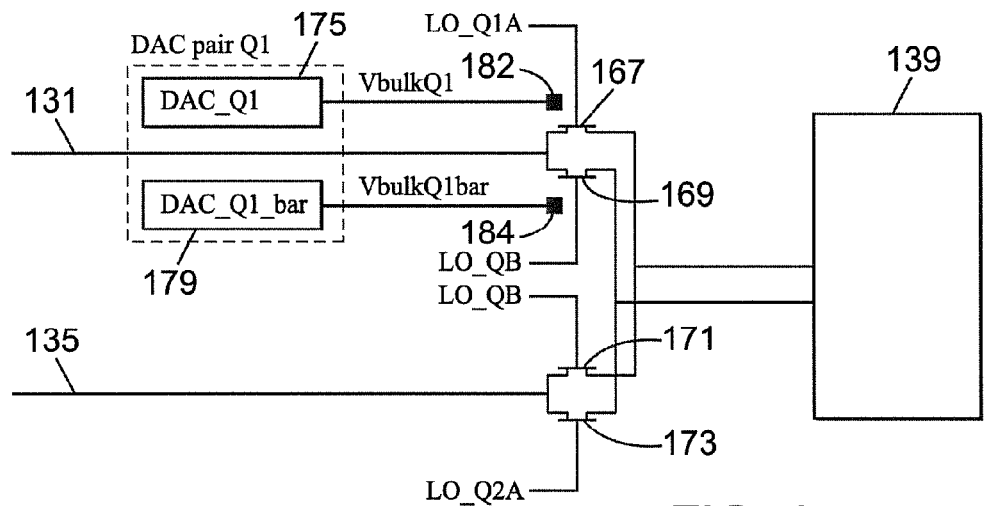
FIG. 4 illustrates detail of the Quadrature path of the receiver of FIG. 2.

This situation is illustrated by FIG. 4. In FIG. 4, for simplicity, only the Quadrature path of the receiver circuit 195 of FIG. 2 is illustrated. However, the skilled person will recognise that the following description will apply equally to the in-phase (I) path.

With reference to FIG. 4, a method of IIP2 calibration may be performed by tuning the bulk voltage of one transistor of the pair of transistors of the mixer.

As illustrated in FIG. 4, the outputs 131, 135 from the transconductance amplifier 129 are each input to a pair of transistors 167, 169, 171, 173 which are configured as passive mixers. Thus, the first output 131 is connected to the source terminals of each of a first nMOS transistor 167 and a second nMOS transistor 169. The drain terminals of each of the first and second transistors 167, 169 are connected to corresponding drain terminals on the second passive mixer. In addition, the drain terminal of the first transistor 167 is connected to a first input to the first trans-impedance amplifier 139.

The second mixer is connected in a corresponding manner to the connections to the first mixer. Thus, the second output 135 from the transconductance amplifier is connected to the source terminals of each of a first nMOS transistor 171 and a second nMOS transistor 173. The drain terminals of each of the first and second transistors 171, 173 are connected to corresponding drain terminals on the first passive mixer as described above. In addition, the drain terminal of the second transistor 173 is connected to a second input to the first trans-impedance amplifier 139.

Figure 1:
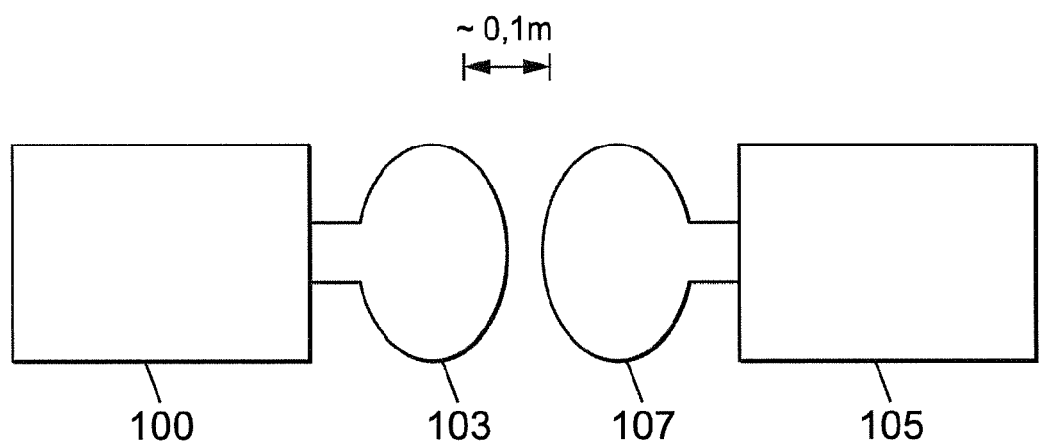
FIG. 1 is a schematic view of two devices configured to communicate using NFC.
Figure 3:
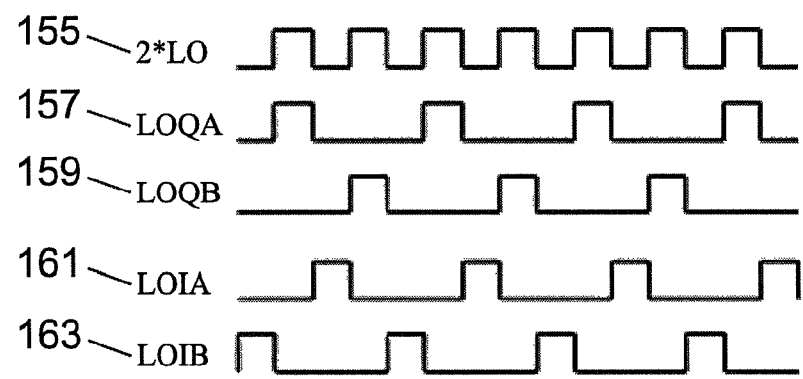
FIG. 3 illustrates signals commonly applied to the receiver of FIG. 2.

To operate as passive mixers, signals are applied to the gate terminals of the transistors 167, 169, 171, 173 as indicated in FIG. 3. FIG. 3 illustrates the digital signals applied to the passive mixer transistors 167, 169, 171, 173 described in FIG. 4.

The first trace 155 in FIG. 3 illustrates a square wave signal that has a frequency that is equal to twice the local oscillator (LO) frequency. This first trace 155 is used by the digital electronics 143 to generate the remaining traces (i.e. inputs) illustrated in FIG. 3.

The second trace 157 is a square pulse signal having a pulse duration that is equal to that of the first trace 155, but that has a repetition frequency equal to the LO frequency. The second trace 157 is applied to the gate connection of the first transistor 167 and also the gate connection of the fourth transistor 173.

The third trace 159 is identical to the second trace 157, but is out of phase with the second trace 157 by one period of the first trace 155. The third trace 159 is applied to the gate connection of the second transistor 169, and also to the gate connection of the third transistor 171.

The fourth trace 161 is identical to the second trace 157 but is out of phase with the second trace 157 by half a period of the first trace 155. The fifth trace 163 is identical to the second trace 157 but is out of phase with the second trace 157 by minus half a period of the first trace 155. The fourth 161 and fifth 163 traces are applied to the transistors of the second passive mixer (not illustrated in FIG. 4) in a manner that corresponds to the application of the second 157 and third 159 traces to the first mixer.

The skilled person will recognise that by applying the traces in the above described manner, the passive mixers are configured to generate quaderature and in-phase signals from the signal originating from the antenna and matching circuit 120. Accordingly, a fuller explanation of the function of the passive mixers 137 will not be made here.

Referring back to FIG. 4, the bulk connections 182, 184 of the first 167 and the second 169 transistors in the first mixer are supplied with signals in the form of a constant bias voltage. The signal supplied to the first transistor 167 bulk connection 181 is the inverse of the signal applied to the second transistor 169 bulk connection 183. In other words, if the signal supplied to the first transistor 167 bulk connection 182 is +x volts relative to ground, then the signal applied to the second transistor 169 bulk connection 184 is −x volts. Accordingly, the signal 175 supplied to the first transistor 167 bulk connection 182 is termed "VbulkQ1", while the signal 179 supplied to the second transistor 149 bulk connection 184 is termed "VbulkQ1bar".

The skilled person will recognise that by applying the VbulkQ1 and VbulkQ1bar voltages in this manner effectively applies an asymmetrical tuning to the mixer formed from the first 167 and second 169 transistors. Thus, by adjustment of the applied voltages, the asymmetry can be varied. Since the asymmetry is applied to only one mixer, the symmetry of this mixer can be tuned such that is it equal to that of the mixer formed by the third 171 and fourth 173 transistors.

The voltages 179 and 175 are generated by the digital block 143 in the form of calibration words (i.e. digital signals) using a calibration routine. The calibration words are converted into analogue voltages by a digital to analogue convertor (not shown). Such calibration routines are known in the art, and so a full description will not be included here. Rather, it is sufficient to note that the calibration routine applies sets of differing voltages 175, 179 to the bulk connectors 182, 184 of the mixer transistors determine the optimum set of voltages that generate a maximum value of IIP2 as described above.

In alternative embodiments instead of, or as-well-as adjusting the bulk-voltages of the mixers 137, the value of IIP2 can alternatively or additionally be calibrated by adjusting any or all of:

- the common-mode voltage of the TIA(s) 139, 140,
- the quality of the local oscillator (LO) I and Q signals,
- the loading of the transistors 167, 169 of the mixers or use of the switchable capacitors 124.

The skilled person will recognise that the digital circuit 143 will generally include all the necessary circuitry to measure IM2 tones with a power as low as −106 dBm (with reference to the input of the receiver) at a good digital precision.

Thus, the only hurdle for IIP2 calibration is generally the design and implementation of a calibration generator, which is capable of generating the required high quality 2-tone stimulus as described above and applying it to the antenna and matching circuit 120.

Figure 5:
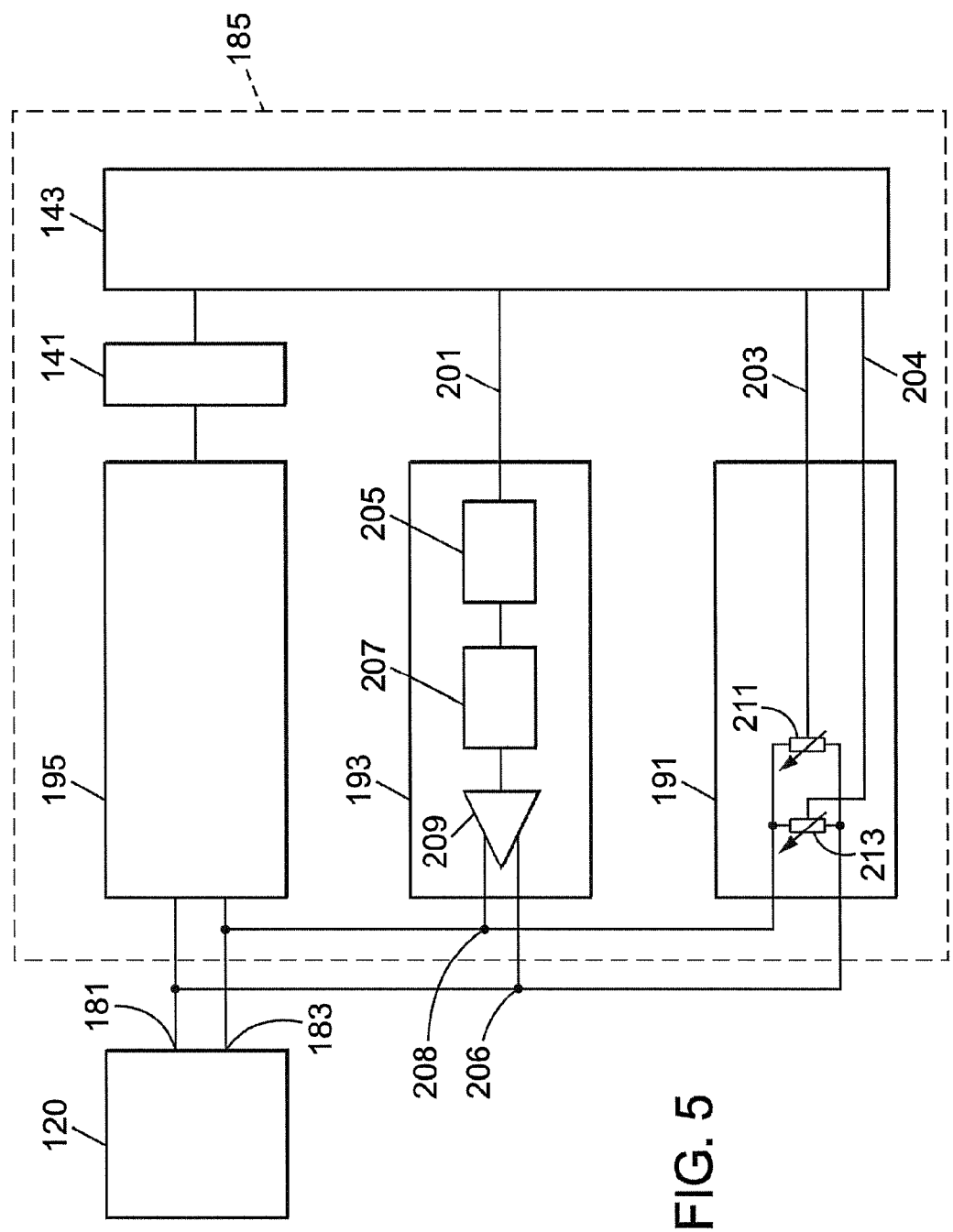
FIG. 5 illustrates a method of performing a calibration on a known NFC reader device according to a described embodiment.

FIG. 5 illustrates a means of supplying the required two-tone stimulus in accordance with an embodiment.

FIG. 5 is a schematic illustration of common architecture used for implementing NFC. As illustrated in FIG. 5, an antenna and matching circuit 120, is connected to an integrated circuit 185 which contains circuitry for implementing NFC. The antenna and matching circuit 120 are connected to the NFC circuit 185 via two electrical inputs 181, 183. The antenna and matching circuit 120 can be any of several known antennas for use with NFC, moreover, the antenna and matching circuit 120 can be the same as that described above in relation to FIG. 2. The skilled person will recognise that the particular antenna and matching circuit 120 used are not relevant for the purpose of this description. Accordingly, further details will be omitted here.

The NFC circuit 185 comprises a receiver 195, an ADC 141, a transmitter 193, a load modulator 191 and a digital electronics circuit 143. The receiver 195, ADC 141 and the digital electronics circuit 143 can be as described in relation to FIG. 2. However, the digital electronics circuit 143 also provides control to the transmitter 193 and the load modulator 191.

The transmitter 193 comprises a digital-to-analogue converter (DAC) 205, which receives a digital signal 201 for generating an RF oscillation form the digital electronics 143. The DAC 205 then supplies an analogue version of the received digital signal 201 to a transimpedance amplifier 207. The transimpedance amplifier 207 amplifies the analogue signal from the DAC 205 and passes the amplified signal to a transmitter amplifier 209 which provides further amplification to the signal. The amplified signal is then passed to the antenna and matching circuit 120 via electrical connections 206, 208 for transmission. The details of this process are known to one skilled in the art, and so a further explanation will not be included here. However, it should be noted that typically in NFC applications, the output from the transmitter comprises a voltage oscillating with a sinusoidal profile at a frequency of 13.56 MHz, which we term here as the carrier frequency, $f_c$. However, the skilled person will recognise that the particular profile and frequency are not relevant, and other profiles and frequencies can equally be employed.

The load modulator 191 comprises switchable resistances 211 and 213. The switchable resistances 211, 213 are each connected across the electrical inputs 181, 183 to the antenna and matching circuit 120. Thus, the switchable resistances 211, 213 are also connected across the outputs of the transmitter amplifier 209. Digital signals 203, 204 are supplied to the switchable resistances 211, 213 from the digital electronics 143 to control switching of the switchable resistors 211, 213. The skilled person will recognise that the first switchable resistor 213 is present in known load modulator 191 circuits, and so its function will not be explained further here. However, in the described embodiment, the load modulator 191 comprises a further switchable resistor having a lower resistance value (when switched on) than the corresponding value of the first switchable resistor 213. In the described embodiment, the first switchable resistor 213 has a resistance value of ~1 kΩ, as for known load modulator devices, while the second switchable resistor has a resistance value of ~100Ω. When switched off, both switchable resistors, 211, 213 have high resistance values. The skilled person will recognise that these values are examples, and other values could equally be used. The function of this additional switchable resistor will be explained in detail below.

The skilled person will recognise that, under normal operation there are two different modes of operation of the NFC circuit 185. Firstly, when the NFC circuit 185 is in a reader mode, then the transmitter 193 and the receiver 195 are active for providing signals to the antenna and matching circuit 120 and analysing received signals respectively. Secondly, when the NFC circuit 185 is operating in a card emulator mode the load modulator 191 is active. These known modes will be familiar to the skilled person, and so a full description will not be repeated here.

However, in brief, in the reader mode the transmitter generates an RF signal that is applied to the antenna 120. As noted above, usually, the RF signal is at a frequency of 13.56 MHz. As a result of the applied signal, the antenna and matching circuit 120 radiates an RF field at 13.56 MHz which is intercepted by an antenna of a nearby device (not illustrated) that is to be interrogated. Owing to its proximity, the nearby device modifies the field transmitted by the antenna and matching circuit 120, and this modification is detected by the receiver 195.

In contrast, when operating in card emulator mode, the transmitter 193 and receiver 195 are not operational. In the card emulator mode, the device is configured to act as an NFC tag device that responds to an interrogation by a nearby reader. Thus, in this mode, the antenna and matching circuit 120 receive a signal from the nearby reader (not shown). The received signal is modified by the load modulator 191 and this modification is detected in a receiver of the nearby reader. The load modulator 191 achieves the modification of the received signal by use of the first switchable resistor 213.

It is also worth noting that, under the two above-described known operating modes, the three circuits (transmitter 193, receiver 195 and load modulator 191) are never all operational concurrently.

The skilled person will recognise that since each of the receiver 195, transmitter 193 and load modulator 191 are connected to the amplifier and matching circuit connections 181, 183, then each of the receiver 195, transmitter 193 and load modulator 191 are also in effect connected together.

The described embodiment exploits the presence of these connections to allow signals from the load modulator 191 and transmitter 193 to be conveyed to the receiver 195. Thus, in the described embodiment the load modulator 191 is configured to be operational concurrently to each of the receiver 195 and the transmitter 193 when the NFC circuit 185 is in a new mode, termed the calibration mode.

When in the calibration mode, the load modulator 191 is configured to apply a load modulation to across the connections 181, 183 to the antenna and matching circuit 120 using the second switchable resistor 211. Since the transmitter 193 is also functioning, the load modulation in turn applies an amplitude modulation to the signal output from the transmitter 193. The load modulation takes the form of a square wave modulation at a predetermined frequency, $f_{am}$. The particular profile and frequency of the load modulation are not relevant to the function of the described embodiment, and different profiles and frequencies can equally be employed.

The skilled person will recognise that if an amplitude modulation at a frequency, $f_{am}$, is applied to a signal at a frequency $f_c$, the carrier frequency produced by the transmitter 193, then two (or more) additional frequencies will be generated in the resulting signal. The two additional frequencies will be $f_1 = f_c + f_{am}$ and $f_2 = f_c - f_{am}$. The skilled reader will appreciate that further additional frequencies may also be generated. However, these will be ignored for the purpose of this discussion.

The skilled person will recognise that the two additional frequencies generate, $f_1$ and $f_2$ can be employed as the two tones for an IIP2 measurement as previously described in relation to FIG. 2.

For use in such a measurement, and also from the description above in relation to FIG. 2, there is a limitation that the difference, Δf, between the frequency of the two new frequencies, $f_1$ and $f_2$ (i.e. $\Delta f = f_2 - f_1$) must be small compared to the channel bandwidth of the RX circuit 195.

Since the connections 181, 183 to the antenna and matching circuit 120 are also connected to the input to the receiver 195, the two tones $f_1$ and $f_2$ will be applied to the inputs 121, 122 to the receiver 195.

When operating in calibration mode, the standard switchable resistor 213 in the load modulator 191 is typically capable of generating a modulation depth of, at most, 7% in the signal from the transmitter 193. Such an small amplitude modulation is typically insufficient for implementation of the two-tone IIP2 measurement of the described embodiment. Accordingly, the additional switchable resistor 211, having a lower resistance value than the standard switchable resistor 213, is additionally included to allow a greater modulation depth to be generated.

However, in further embodiments, the standard switchable resistor 213 is employed for the purpose of amplitude modulation in the calibration mode. Accordingly, in such embodiments the additional switchable resistor 211 need not be present in the load modulator 191.

The skilled person will recognise that the calibration must be performed in the absence of strong magnetic fields at the antenna and matching circuit 120. This is because such fields would induce currents in the antenna and matching circuit 120 that would in turn generated spurious signals in the receiver. Accordingly, the calibration mode of the described embodiment includes a step of measuring the noise floor resulting from external fields. The results of the calibration mode are disregarded if the measured noise floor is above a predetermined level.

Moreover, use of the calibration mode will result in the generation of a magnetic field at the antenna and matching circuit 120. This field is not used during the calibration mode, however for a proper calibration it is necessary to ensure that this field is not modified, for example by the presence of a nearby NFC tag or NFC reader.

Figure 6:
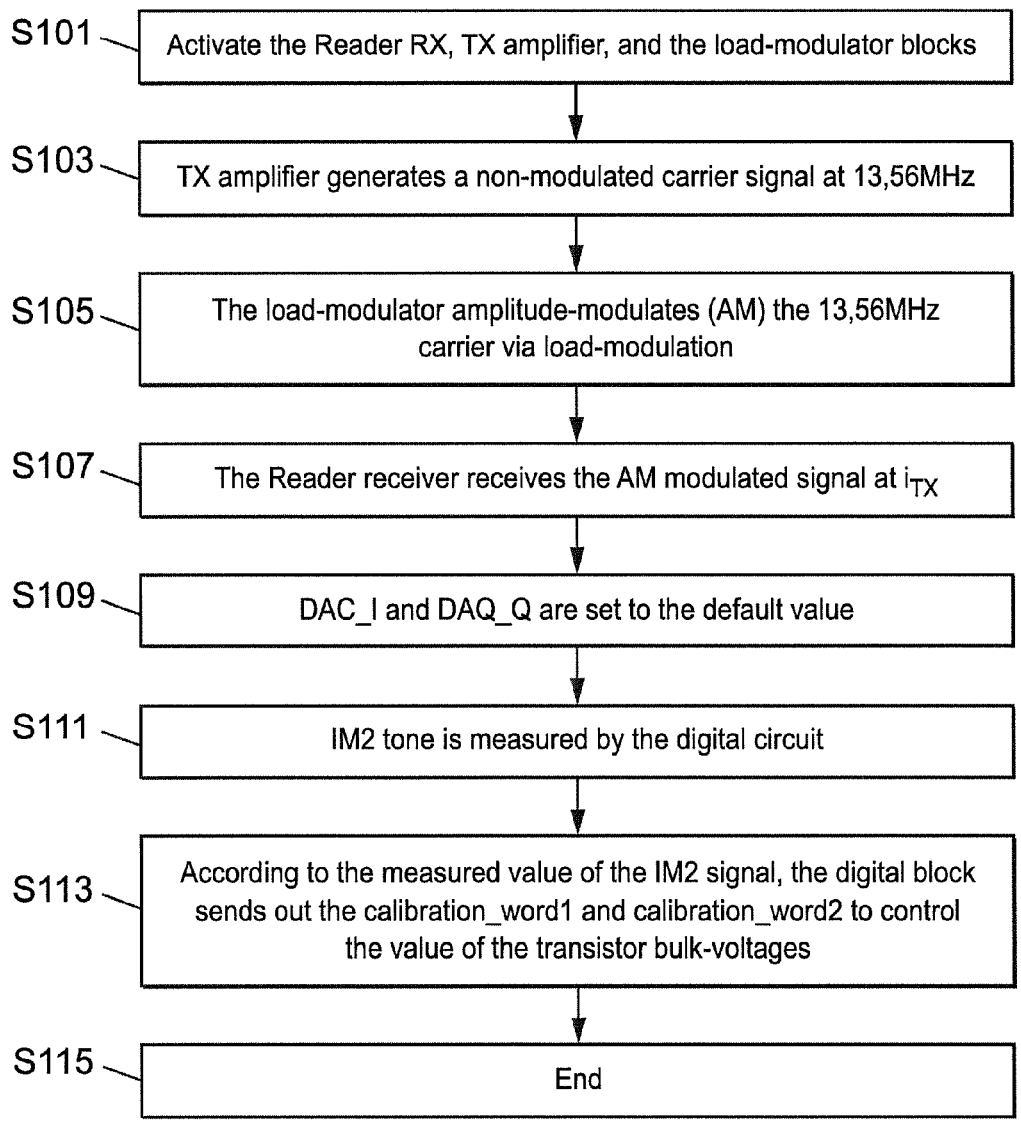
FIG. 6 illustrates a flow chart for a calibration according to the embodiment of FIG. 5.

FIG. 6 illustrates a flow chart of the calibration mode of the described embodiment.

Firstly, in step S101, the digital circuit 143 activates each of the Reader 195, the transmitter 193, and the load-modulator 191. Subsequently, in S103, the TX amplifier 209 generates a non-modulated carrier signal at 13.56 MHz (as in normal operation). In step S105, the load-modulator amplitude-modulates (AM) the 13.56 MHz carrier via load-modulation. Thus in step S105, the double-tone stimulus using the two tones $f_1$ and $f_2$, chosen to be within the bandwidth of the receiver 195 are generated. The modulation depth is selected to be the minimum level that is sufficient to measure the IM2 tones with the precision that is afforded by the digital circuit 143.

Subsequently, in step S107, the Reader receiver 195 receives the AM modulated signal at its inputs 121, 122 via the connections 123, 125 that connect the transmitter 193 to the antenna and matching circuit 120. In step S109 DAC_I and DAQ_Q are set to their default values, and in step S111 the intermodulation tone (IM2) is measured by the digital circuit 143. This measurement is made by applying a narrow digital band pass filter (BPF) with a centre frequency at (f1−f2) to the received signal. The output of the BPF is the value of the IM2 tone.

The skilled reader will note that (f1−f2) is equal to two times the frequency at which the amplitude modulation pattern is toggling. The amplitude modulation pattern produced b the digital electronics 143 takes the form of a sequence [010101010 . . . ]. Thus, according to this sequence, the additional load modulation resistance 211 is switched on when the sequence is a 1, and switched off when the sequence is a 0. As a result, the square wave amplitude modulation is generated.

In step S113, the digital circuit 143 sends out calibration_word1 and calibration_word2 messages to control the value of the transistor bulk-voltages in accordance with the measured value of the IM2 signal. The values of calibration_word1 and calibration_word2 are derived via a calibration routine which will be explained below in relation to FIG. 7.

In the described embodiment, calibration_word1 and calibration_word2 are 8-bit signals. However, calibration words that employ a greater of lesser number of bits can equally be employed.

After sending the calibration words, in step S115, the NFC circuit 185 will exit the calibration mode, and normal operation in either the reader mode or the card emulator mode can be resumed.

Two different calibration routines are employed in the described embodiment, an initial calibration, and an "in-operation" calibration.

The initial calibration is used to calibrate the NFC circuit 185 from initial switch-on. Typically, this calibration will employ a Nelder-Mead optimisation technique, and will require approximately 20 iterations to arrive at a stable calibration of the NFC circuit 185. The initial calibration is normally used to perform a coarse calibration. The in-operation calibration routine is used during operation, typically every second, to perform a finer calibration than the initial calibration routine. By using repeating the routine at such a frequency, the effect of temperature variation at the NFC circuit will not tend to be significant. However, other repetition frequencies of both of the calibration routines can equally be employed.

Figure 7:
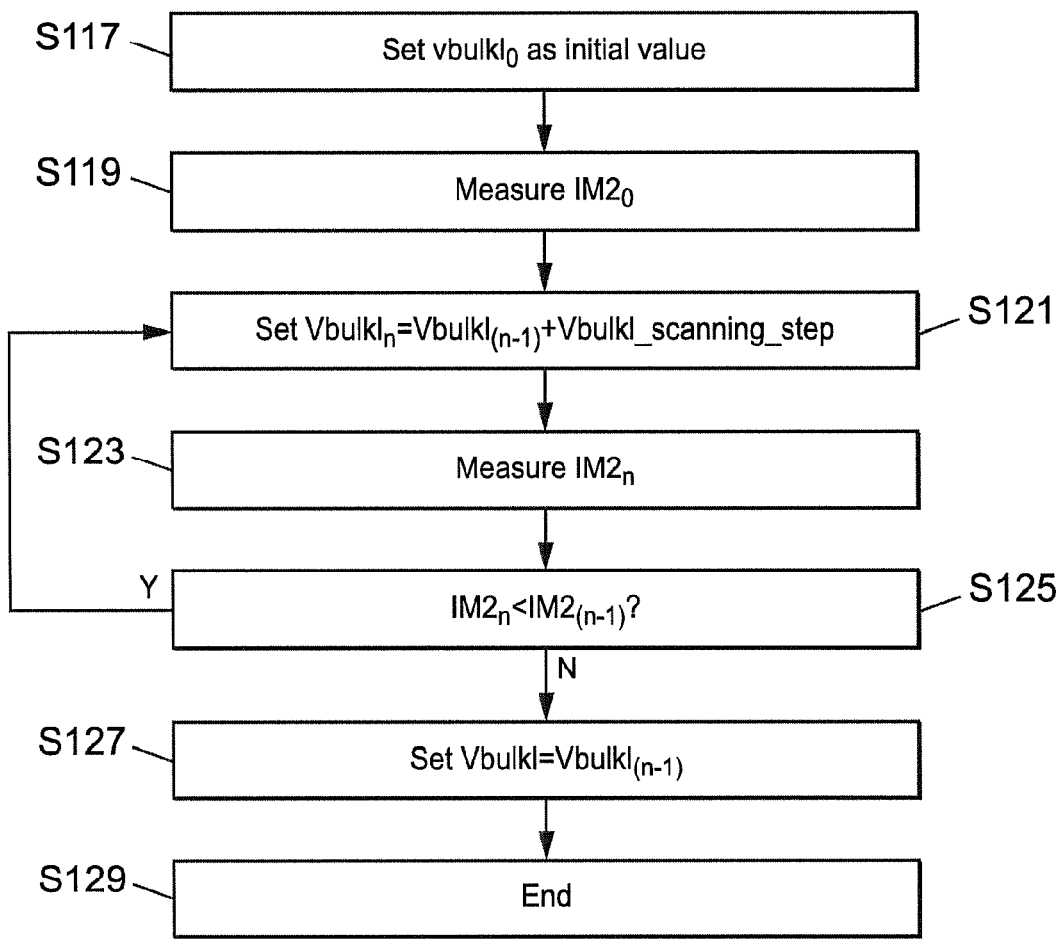
FIG. 7 illustrates an in-operation calibration routine.

A typical in-operation calibration routine is illustrated in FIG. 7. As illustrated, in step S117, the value of the bulk voltage applied to a transistor in the mixers 137 is set to an initial voltage, $vbulkI_0$. Typically, this voltage will be sufficiently low to ensure that the mixers 137 are not symmetrically tuned, and so do not provide the lowest value of IM2.

Subsequently, in step S119 the value of $IM2_0$ is measured. $IM2_0$ is defined as the value of IM2 that is achieved with a bulk voltage of $vbulkI_0$. This measurement can be made using known techniques as described in relation to FIG. 2. In step S121, the value of the bulk voltage is incremented by an amount, here termed $vbulk1_{scanning\_step}$, to give a new value of the bulk voltage, generally termed $vbulkI_n$. In step S123, the value of $IM2_n$, i.e. the value of IM2 achieved for a bulk voltage of $vbulkI_n$ is measured. In step S125, the value of $IM2_n$ is compared with the value of IM2 achieved using the value of the bulk voltage from the previous iteration, $IM2_{(n-1)}$. If the current value of IM2, $IM2_n$ is lower than the previous value, $IM2_{(n-1)}$, then steps S121, S123 and S125 are repeated to increment the bulk voltage further, and re-test. This process is repeated so long as the value of $IM2_n$ is lower than the value of $IM2_{(n-1)}$.

If the value of $IM2_n$ is not lower than $IM2_{(n-1)}$, then vbulkI is set equal to $vbulkI_{(n-1)}$ in step S127, and the calibration routine ends in step S129.

As noted above, the presence of external noise in the receive signal will normally be checked prior to acceptance of the calculated calibration value of vbulkI. Typically, if the result is unexpected, a recalibration will be performed.

Simulation Results

Figure 8:
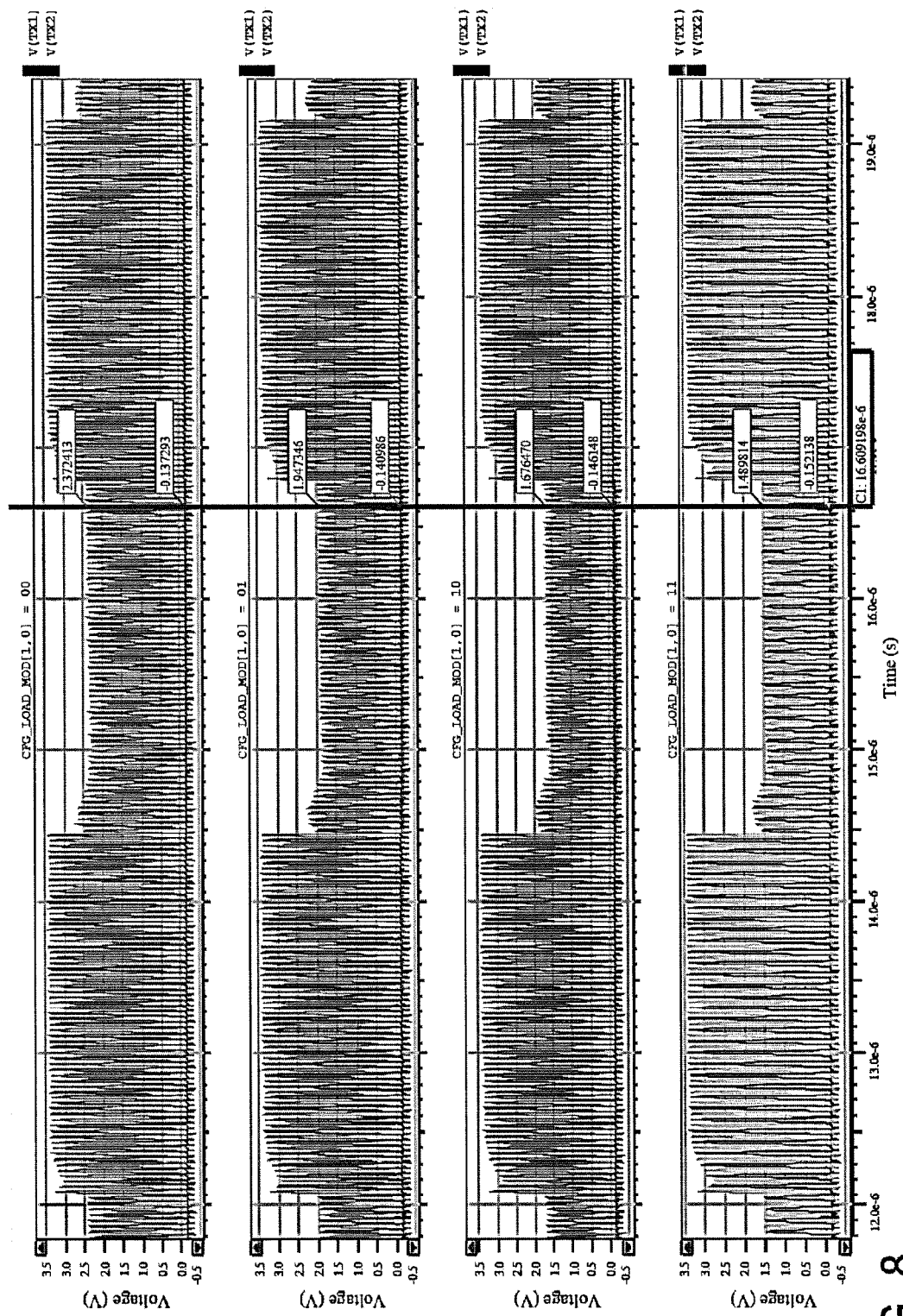
FIG. 8 illustrates simulated results from the method of FIG. 5.

FIG. 8 illustrates sample results from a simulation of the described embodiment. In FIG. 8, V(TX1) and V(TX2) correspond to positive and negative signals, respectively, of the differential stimulus applied to the inputs 121, 122 of the receiver 195. In FIG. 8, a 13.56 MHz carrier is amplitude modulated by $f_1$ and $f_2$. Here $f_1$ and $f_2$ are chosen to each be separated from the carrier frequency by 106 KHz. The amplitude modulation is achieved, as is described above, by switching of the additional switchable resistor 211 in the load modulator 191. This switching is effected using a rectangular-wave profile, thus the resulting amplitude modulation also has a rectangular profile.

The four traces in FIG. 8 each correspond to a different effective value of the load modulator additional switchable resistor 211. The different values are as indicated in table 1 below, where CFG_LOAD_MOD indicates the resistance value:

TABLE 1

| Name CGF_LOAD_MOD[1:0] | Ohms Before Mod Ohms | Ohms After Mod Ohms | Est. Mod Resistance ~Ohms |
|---|---|---|---|
| [0, 0] | 21.8 | 14.2 | 40.7 |
| [0, 1] | 21.8 | 11.4 | 23.8 |
| [1, 0] | 21.8 | 9.7 | 17.8 |
| [1, 1] | 21.8 | 8.5 | 13.9 |

The first (top) trace in FIG. 8 corresponds to the resulting modulation when a modulation resistance of 40.7Ω is used, and the subsequent traces show the results for 23.8, 17.5 and 13.9Ω respectively. As can be seen from FIG. 8, the amplitude modulation will be shallow when a high value of the load modulator resistance 211 is employed and deeper when a lower load modulator resistance 211 is used.

In the described embodiment, the additional load modulator resistor 211 is selected to give a modulation depth such that the stimulus applied to the receiver 195 has sideband tones ($f_1$ and $f_2$), which each have an amplitude that is approximately equal to half of the maximum stimulus amplitude (i.e. half of the maximum amplitude of the amplitude modulated signal from the transmitter 193.

In FIG. 8, the amplitude modulation pattern toggles at a bit rate of 106 kbps and each of $f_1$ and $f_2$ are separated from the carrier frequency by 106 KHz. Thus $f_1$=13.56 MHz+106 kHz and $f_2$=13.56 MHz−106 kHz. Assuming that the NFC reader is a zero-intermediate-frequency (ZIF) receiver, then this implies that the IM2 tone is located at $f_1-f_2-f_{LO}$=212 kHz. This can be seen to be the case in FIG. 8, since the resulting modulation appears in the form of a signal at 212 KHz.

Figure 9:
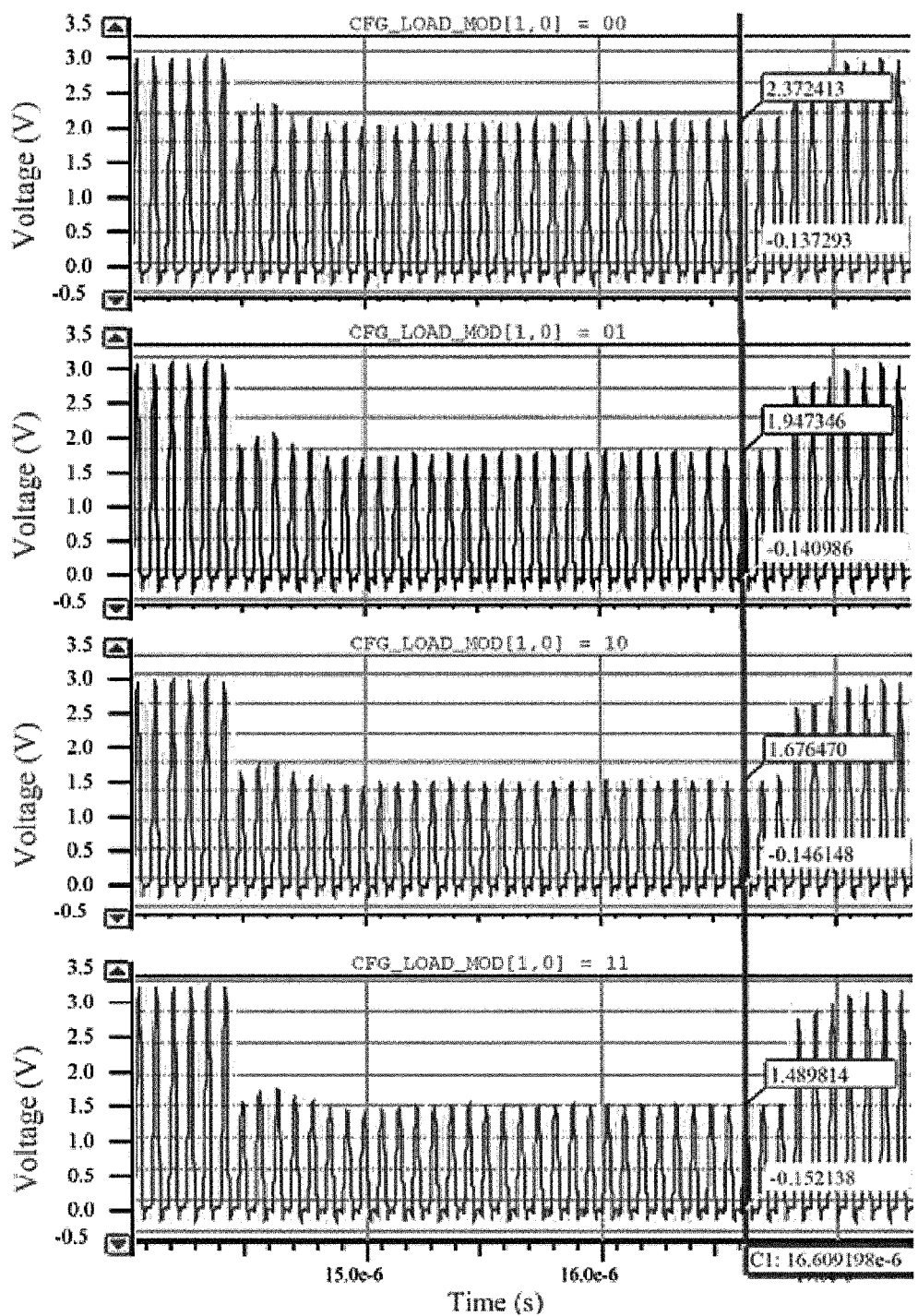
FIG. 9 illustrates details of the results of FIG. 8.

FIG. 9 illustrates detail of the traces shown in FIG. 8, and for clarity, only the voltage of V(TX1) is shown. However, the skilled person will recognise that V(TX2) will form a signal of the same frequency as V(TX1) and follow the same amplitude modulation envelope, but be in anti-phase with V(TX1).

FIG. 9, illustrates that V(TX1) has an underlying modulation at the carrier frequency (13.56 MHz), and this is modulated by the amplitude modulation at 106 kHz. As can be seen in FIG. 9, during the central portion of the trace, the maximum amplitude is lower than at the edges. The skilled person will recognise that the central portion therefore corresponds to the period when the amplitude is modulated by the additional switching resistor 211 being switched on (i.e. low resistance), while the edges correspond to the resistor 211 being switched off (i.e. high resistance).

The maximum (unmodulated) voltage amplitude in the first trace is approximately 3V, while the minimum is −0.14, as is noted on the Figure. The maximum amplitude during the period when the modulation is applied is 2.4V. Thus, the fractional amplitude modulation achieved in the first trace is approximately 1−(2.4+0.14)/(3_0.14)=0.19.

The corresponding values for traces 2 to 4 are 0.35, 0.41 and 0.48 respectively.

Since the signal applied to the modulating signal is a rectangular signal, higher order (i.e. harmonic) frequency images that satisfy the relation:

$$n*[13.56 \text{ MHz} \pm 106 \text{ kHz}], n=2, 3, 4, \ldots \quad (1)$$

are expected to be observed in the spectra of V(TX1), V(TX2), and $i_{TX}$. This expected effect is illustrated by the frequency rays plotted on the top graph of FIG. 10.

Figure 10:
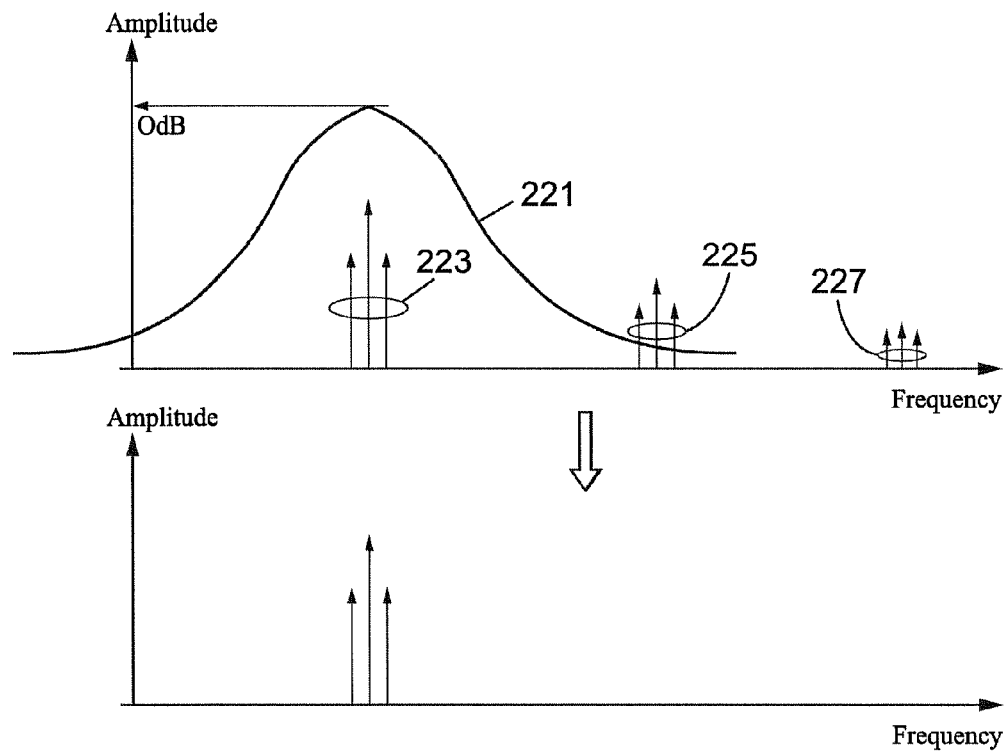
FIG. 10 illustrates a simulated frequency spectrum resulting from the method of FIG. 5.

FIG. 10 illustrates the expected frequency spectrum from application of the amplitude modulation of the described embodiment. Since the carrier frequency is located at 13.56 MHz, and the side-bands are generated at 106 kHz either side of this, it is expected to observe these frequencies as a triplet 223. As noted above, is it also expected to observe further triplets that satisfy relation (1), and these are illustrated as 225 and 227. As illustrated, the higher-order triplets are expected to generally have a lower amplitude than lower-order triplets. The existence of the higher-order triplets 225, 227 will be detrimental to the calculation of the IM2 because many IM2 tones, one relative to each higher order frequency image, would be superimposed over each other at 212 kHz.

However, this detrimental effect does not in practice occur because the relatively high resonance at the terminals 181, 183 of the antenna and matching circuit 120. This resonance will tend to filter out the higher order frequency images (triplets). This effect is also illustrated in FIG. 10, which superimposes a plot of the transfer function 221 across the terminals 181, 183 of the antenna and matching circuit 120 on the frequency spectrum. The transfer function 221 is approximately Gaussian in profile and centred at the carrier frequency of 13.56 MHz. Owing to the limited width of the transfer function 221, the amplitude of the second-order 225, and higher-order 227 triplets will be attenuated.

The lower plot in FIG. 10 illustrates the expected frequency spectrum that results from the generated frequency spectrum of the upper plot being modified by the transfer function 221. As can be seen, only the lowest order triplet at 13.56 MHz and 13.56 MHz±106 kHz remains, whilst the higher-order triplets 225, 227 do not appear due to their attenuation by the transfer function 221.

Thus, the described embodiment provides a high quality double-tone signal that lies in the bandwidth of the Reader RX. The skilled person will recognise that this is the stimulus that is required in order to measure the IM2 (at f1−f2=212 kHz) of the Reader RX chain.

The skilled reader will also appreciate that the frequency component at 13.56 MHz will be down-converted by the mixers 137 in the receiver 195 to a DC component. As a result, the presence of the carrier frequency in the frequency spectrum will not impact the IM2 measurement.

During the IIP2 calibration, $f_1$ and $f_2$ as generated by the applied amplitude modulation of the signal from the transmitter 193 will traverse the Reader receiver 195, and generate a digitised signal at the output of the ADC 141. As explained in relation to FIG. 2, this digitised signal will also contain the IM2 tone, which is caused by the second-order inter-modulation between $f_1$ and $f_2$. This means that the IM2 tone is located at $f_1-f_2$ in the frequency domain at the output of the ADC 141.

In the digital circuit 143, the IM2 tone is selected from the digitised signal using a digital narrow band-pass filter (not illustrated) to thereby permit the amplitude of IM2 to be measured. The skilled person will recognise how to implement such a filter, and so further details will be omitted here.

As noted above in relation to the calibration state machine of FIG. 6, measurements of the IM2 tone are made several times during the calibration process, until the Reader RX path reaches an acceptable, (i.e. sufficiently small) value of IM2. When this is achieved, the Reader RX IIP2 is considered to be calibrated.

Thus, the described embodiments provide methods of on-chip load-modulated stimulus generation for test and calibration of an NFC circuit. Advantageously, in some embodiments, no additional hardware is required since the method employs the load-modulator and power amplifier which are already available on the NFC chip as standard.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

The embodiments as herein described can be embedded in a computer program product, which comprises all the features enabling the implementation of the methods described herein, and which—when loaded in an information processing system—is able to carry out these methods. Computer program means or computer program in the present context mean any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

A person skilled in the art will readily appreciate that various parameters disclosed in the description may be modified and that various embodiments disclosed and/or claimed may be combined without departing from the scope of the invention.

The invention claimed is:

1. A method of determining a calibration of a near field communication, NFC, device, the NFC device comprising a receiver circuit, a transmitter circuit and a load modulator circuit, the method comprising:
    activating a calibration mode in which the load modulator circuit is configured to be operational concurrently to each of the receiver circuit and the transmitter circuit;
    generating a carrier signal in the transmitter circuit,
    generating a modulation signal in the load modulator circuit by switching a resistance in the load modulator circuit to a resistance that is lower than a resistance in the load modulator circuit when the NFC device is operating in a card emulator mode,
    generating a modulated carrier signal, comprising first and second frequencies, by applying the modulation signal to the carrier signal,
    applying the modulated carrier signal at an input of the receiver circuit, and
    determining a response parameter of the receiver circuit on the basis of the response of the receiver circuit to the first and second frequencies in the modulated carrier signal.

2. A method according to claim 1, wherein the determined response parameter is the second order input intercept point.

3. A method according to claim 1, wherein the response parameter is determined on the basis of the response at an intermodulation frequency, $f_{IM2}$, corresponding to:

$$f_{IM2}=f_1-f_2-f_{IF}$$

where $f_1$ and $f_2$ are the first and second frequencies respectively and $f_{IF}$ is an intermediate frequency of an amplifier in the receiver circuit.

4. A method according to claim 3, wherein $f_{IF}=0$.

5. A method according to claim 3, wherein $f_{IM2}$ is within the bandwidth of the receiver circuit.

6. A method according to claim 1, further comprising adjusting a parameter of a component within the receiver circuit to thereby alter the response parameter.

7. A method according to claim 6, wherein repeated determinations of the response parameter are made, each with a different value of the parameter to thereby determine an optimum value of the parameter.

8. A method according to claim 6, wherein the parameter is a bulk voltage of a transistor in the receiver circuit.

9. A method according to claim 1, further comprising determining a received noise level at the receiver circuit in the absence of the applied modulated carrier signal.

10. A near field communication, NFC, device, comprising a receiver circuit, a transmitter circuit and a load modulator circuit, wherein the device is configured to:
    activate a calibration mode in which the load modulator circuit is configured to be operational concurrently to each of the receiver circuit and the transmitter circuit;
    generate a carrier signal in the transmitter circuit,
    generate a modulation signal in the load modulator circuit by switching a resistance in the load modulator circuit to a resistance that is lower than a resistance in the load modulator circuit when the NFC device is operating in a card emulator mode, generate a modulated carrier signal, comprising first and second frequencies, by applying the modulation signal to the carrier signal, apply the modulated carrier signal at an input of the receiver circuit, and determine a response parameter of the receiver circuit on the basis of the response of the receiver circuit to the first and second frequencies in the modulated carrier signal.

11. An NFC device according to claim 10, wherein the device forms a part of at least one of: a mobile telephone, a tablet computer, a laptop computer or a smart phone.

12. A non-transitory computer readable medium comprising a computer program product, which comprises computer readable instructions which, when run on a computer system, cause the computer system to:

activate a calibration mode in which the load modulator circuit is configured to be operational concurrently to each of the receiver circuit and the transmitter circuit;

generate a carrier signal in the transmitter circuit, generate a modulation signal in the load modulator circuit by switching a resistance in the load modulator circuit to a resistance that is lower than a resistance in the load modulator circuit when the NFC device is operating in a card emulator mode, generate a modulated carrier signal, comprising first and second frequencies, by applying the modulation signal to the carrier signal, apply the modulated carrier signal at an input of the receiver circuit, and determine a response parameter of the receiver circuit on the basis of the response of the receiver circuit to the first and second frequencies in the modulated carrier signal.

* * * * *